United States Patent
Luo et al.

(10) Patent No.: US 12,283,248 B1
(45) Date of Patent: Apr. 22, 2025

(54) CIRCUITRY STRUCTURE AND DISPLAY SUBSTRATE

(71) Applicant: BOE TECHNOLOGY GROUP CO., LTD., Beijing (CN)

(72) Inventors: Chengyuan Luo, Beijing (CN); Pan Xu, Beijing (CN); Ying Han, Beijing (CN); Donghui Zhao, Beijing (CN); Guangshuang Lv, Beijing (CN); Xing Zhang, Beijing (CN); Miao Liu, Beijing (CN); Xing Yao, Beijing (CN); Cheng Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/577,444

(22) PCT Filed: Mar. 29, 2023

(86) PCT No.: PCT/CN2023/084778
§ 371 (c)(1),
(2) Date: Jan. 8, 2024

(87) PCT Pub. No.: WO2024/197652
PCT Pub. Date: Oct. 3, 2024

(51) Int. Cl.
*G09G 3/3266* (2016.01)
*H10K 59/131* (2023.01)

(52) U.S. Cl.
CPC ......... *G09G 3/3266* (2013.01); *H10K 59/131* (2023.02)

(58) Field of Classification Search
CPC ............................ H10K 59/131; G09G 3/3266
See application file for complete search history.

(56) References Cited

U.S. PATENT DOCUMENTS

| | | | |
|---|---|---|---|
| 11,968,862 B2 * | 4/2024 | Diao | H10K 59/126 |
| 2021/0166645 A1 * | 6/2021 | Li | G09G 3/3648 |
| 2021/0358420 A1 | 11/2021 | Yang et al. | |

FOREIGN PATENT DOCUMENTS

| | | |
|---|---|---|
| CN | 109509446 B | 6/2021 |
| KR | 20180017302 A | 2/2018 |
| WO | 2022/227478 A1 | 11/2022 |
| WO | 2022/232987 A1 | 11/2022 |
| WO | 2022/233120 A1 | 11/2022 |
| WO | 2022/257083 A1 | 12/2022 |
| WO | 2023/016358 A1 | 2/2023 |

* cited by examiner

*Primary Examiner* — Sardis F Azongha
(74) *Attorney, Agent, or Firm* — WHDA, LLP

(57) ABSTRACT

The present disclosure provides a circuitry structure and a display substrate. The circuitry structure includes a base substrate, and a functional transistor and a signal transmission line arranged on the base substrate. The functional transistor includes a first conductive connection member, a first electrode, a second electrode, at least two gate electrode patterns and at least one active pattern. Orthogonal projections of the first electrode, the second electrode and the at least two gate electrode patterns onto the base substrate at least partially overlap with an orthogonal projection of the active pattern onto the base substrate, and first ends of the gate electrode patterns are coupled to each other. The first conductive connection member is arranged at a layer different from the gate electrode pattern, and coupled to second ends of the gate electrode patterns. The signal transmission line is coupled to the first conductive connection member.

20 Claims, 6 Drawing Sheets

CIRCUITRY STRUCTURE AND DISPLAY SUBSTRATE

CROSS-REFERENCE TO RELATED APPLICATION

This application is the U.S. national phase of PCT Application No. PCT/CN2023/084778 filed on Mar. 29, 2023, which is incorporated herein by reference in its entirety.

TECHNICAL FIELD

The present disclosure relates to the field of electronic elements, in particular to a circuitry structure and a display substrate.

BACKGROUND

As a new-generation display technology, Organic Light-Emitting Diode (OLED) display technology is widely used due to such advantages as rapid response, high contrast and flexibility. A gate driving circuitry in an OLED display product is directly integrated in a non-display region of an array substrate so as to replace a driving chip externally coupled to the array substrate. This design has advantages of low manufacture cost, fewer process steps and small tact time, and it is known as Gate Driver on Array (GOA).

SUMMARY

An object of the present disclosure is to provide a circuitry structure and a display substrate, so as to solve problems in the related art.

In order to achieve the above-mentioned object, the present disclosure provides the following technical solutions.

In one aspect, the present disclosure provides in some embodiments a circuitry structure, including a base substrate, and a functional transistor and a signal transmission line arranged on the base substrate. The functional transistor includes a first conductive connection member, a first electrode, a second electrode, at least two gate electrode patterns and at least one active pattern; an orthogonal projection of the first electrode onto the base substrate at least partially overlaps with an orthogonal projection of the active pattern onto the base substrate, and an orthogonal projection of the second electrode onto the base substrate at least partially overlaps with the orthogonal projection of the active pattern onto the base substrate; orthogonal projections of the at least two gate electrode patterns onto the base substrate at least partially overlap with the orthogonal projection of the active pattern onto the base substrate, first ends of the at least two gate electrode patterns are coupled to each other, and the at least two gate electrode patterns form a non-closed loop structure on a film layer where the at least two gate electrode patterns are located; the first conductive connection member is arranged at a layer different from the gate electrode pattern and coupled to second ends of the at least two gate electrode patterns; and the signal transmission line is coupled to the first conductive connection member.

In a possible embodiment of the present disclosure, a distance between the second ends of adjacent gate electrode patterns is greater than or equal to a distance between middle portions of the adjacent gate electrode patterns, and the middle portion is located between the first end and second end.

In a possible embodiment of the present disclosure, the functional transistor further includes a second conductive connection member, the first ends of the at least two gate electrode patterns are coupled to each other through the second conductive connection member, and the second conductive connection member is arranged at a same layer and made of a same material as the gate electrode patterns.

In a possible embodiment of the present disclosure, the first conductive connection member is arranged at a same layer and made of a same material as the first electrode and the second electrode.

In a possible embodiment of the present disclosure, the signal transmission line and the first conductive connection member form a one-piece structure.

In a possible embodiment of the present disclosure, the signal transmission line is arranged at a same layer and made of a same material as the gate electrode pattern.

In a possible embodiment of the present disclosure, the signal transmission line is in contact with a second end of one of the gate electrode patterns.

In a possible embodiment of the present disclosure, the functional transistor includes at least two active patterns arranged in a first direction, the gate electrode pattern extends in the first direction, the first electrode and the second electrode are arranged opposite to each other in a second direction, and the first direction intersects the second direction.

In a possible embodiment of the present disclosure, the circuitry structure includes at least two functional transistors arranged in the second direction, the first conductive connection members of the at least two functional transistors form a one-piece structure, the second conductive connection members of the at least two functional transistors form a one-piece structure, and a second electrode of one of the two adjacent functional transistors is reused as a first electrode of the other functional transistor.

In a possible embodiment of the present disclosure, the circuitry structure includes an active layer, a gate insulation layer, a gate metal layer, an interlayer insulation layer and a source/drain metal layer laminated one on another on the base substrate in a direction away from the base substrate, the active layer includes a plurality of first functional patterns, the first functional patterns include the active patterns, the gate metal layer includes a plurality of second functional patterns, the second functional patterns include the gate electrode patterns, the interlayer insulation layer includes a plurality of via-holes, the source/drain metal layer includes a plurality of third functional patterns, and the third functional patterns include the first electrode and the second electrode.

In a possible embodiment of the present disclosure, a width of the first functional pattern in a direction perpendicular to an extending direction of the first functional pattern is greater than or equal to a+Xa+Ya, where 4.5 µm≤a≤7 µm, 0.1 µm≤Xa≤0.5 µm, and 0.1 µm≤Ya≤0.5 µm.

In a possible embodiment of the present disclosure, a distance between adjacent first functional patterns is greater than or equal to Xa+4 µm.

In a possible embodiment of the present disclosure, a width of the second functional pattern in a direction perpendicular to an extending direction of the second functional pattern is greater than or equal to g+Xg+Yg+2*d1/tan (α1), where 4.5 µm≤g≤6.5 µm, 0.6 µm≤Xg≤2 µm, 0.6 µm≤Yg≤2 µm, α1 is a slope angle of the second functional pattern, and 2000 Å≤d1≤8000 Å.

In a possible embodiment of the present disclosure, a distance between adjacent second functional patterns is greater than or equal to Xg+2 µm.

In a possible embodiment of the present disclosure, a width of the third functional pattern in a direction perpendicular to an extending direction of the third functional pattern is greater than or equal to s+Xs+Ys+2*d2/tan ($\alpha 2$), where 4.5 µm≤g≤6.5 µm, 0.6 µm≤Xs≤2 µm, 0.6 µm≤Ys≤2 µm, $\alpha 2$ is a slope angle of the third functional pattern, and 2000 Å≤d2≤8000 Å.

In a possible embodiment of the present disclosure, a distance between adjacent third functional patterns is greater than or equal to Xs+2 µm.

In a possible embodiment of the present disclosure, the third functional pattern is coupled to the first functional pattern through a corresponding via-hole and coupled to the second functional pattern through a corresponding via-hole, pore sizes H of the via-holes satisfy H≥h, and 1 µm≤h≤3 µm.

In a possible embodiment of the present disclosure, a distance between a boundary of an orthogonal projection of the first functional pattern onto the base substrate and a boundary of an orthogonal projection of the corresponding via-hole onto the base substrate is greater than or equal to H+Xh+Yh; and/or a distance between a boundary of an orthogonal projection of the second functional pattern onto the base substrate and a boundary of an orthogonal projection of the corresponding via-hole onto the base substrate is greater than or equal to H+Xh+Yh; and/or a distance between a boundary of an orthogonal projection of the third functional pattern onto the base substrate and a boundary of an orthogonal projection of the corresponding via-hole onto the base substrate is greater than or equal to H+Xh+Yh, where 0.1 µm≤Xh≤1 µm, and 0.1 µm≤Yh≤1 µm.

In a possible embodiment of the present disclosure, a distance between the orthogonal projection of the first electrode onto the base substrate and/or the orthogonal projection of the second electrode onto the base substrate and the orthogonal projection of the adjacent gate electrode pattern onto the base substrate is greater than or equal to (Xg+Yg+Xs+Ys)/2, where 0.6 µm≤Xg≤2 µm, 0.6 µm≤Yg≤2 µm, 0.6 µm≤Xs≤2 µm, and 0.6 µm≤Ys≤2 µm.

In a possible embodiment of the present disclosure, the active pattern includes at least two channel portions, an orthogonal projection of the channel portion onto the base substrate overlaps with the orthogonal projection of the corresponding gate electrode pattern onto the base substrate, a width W of the channel portion in an extending direction of the gate electrode pattern satisfies 5 µm≤W≤20 µm, and a length L of the channel portion in a direction perpendicular to the extending direction of the gate electrode pattern satisfies 2 µm≤L≤4 µm.

In a possible embodiment of the present disclosure, the circuitry structure includes a gate driving circuitry, the gate driving circuitry includes a gate driving signal output end and a pull-down transistor coupled to the gate driving signal output end, and the functional transistor includes the pull-down transistor.

In a possible embodiment of the present disclosure, the circuitry structure includes a gate driving circuitry, the gate driving circuitry includes a triggering signal output end and an output transistor coupled to the triggering signal output end, and the functional transistor includes the output transistor.

In a possible embodiment of the present disclosure, the at least two gate electrode patterns are formed through wet etching.

In another aspect, the present disclosure provides in some embodiments a display substrate including the above-mentioned circuitry structure.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. In these drawings.

FIG. 7 is a schematic view showing the layout of the gate metal layer in

FIG. 5;

FIG. 11 is a schematic view showing the layout of the gate metal layer in

FIG. 9;

DETAILED DESCRIPTION

Figure 1:
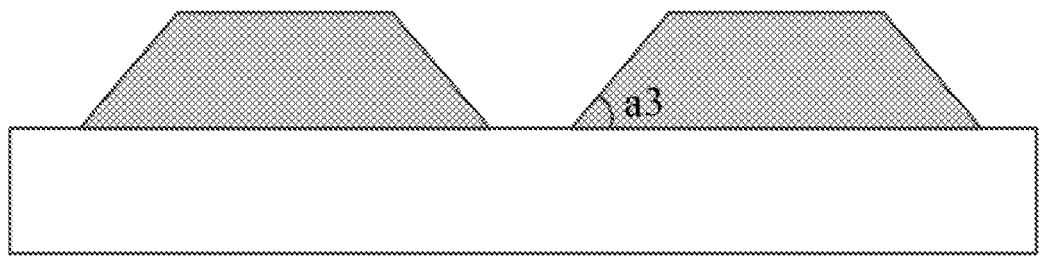
FIG. 1 is a schematic view showing a slope angle formed through a Mo dry etching process according to one embodiment of the present disclosure.
Figure 2:
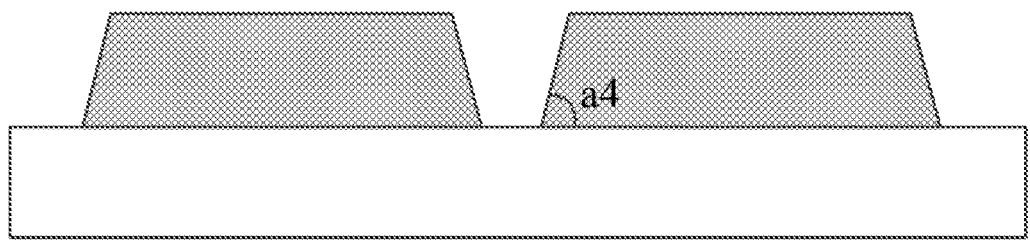
FIG. 2 is a schematic view showing a slope angle formed through a Mo wet etching process according to one embodiment of the present disclosure.
Figure 3:
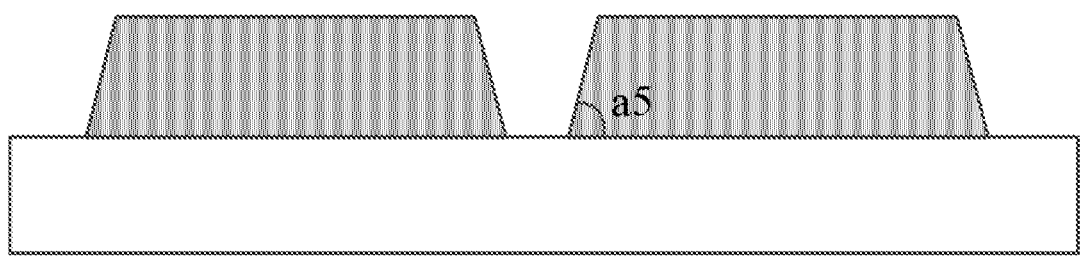
FIG. 3 is a schematic view showing a slope angle formed through an Al dry etching process according to one embodiment of the present disclosure.
Figure 4:
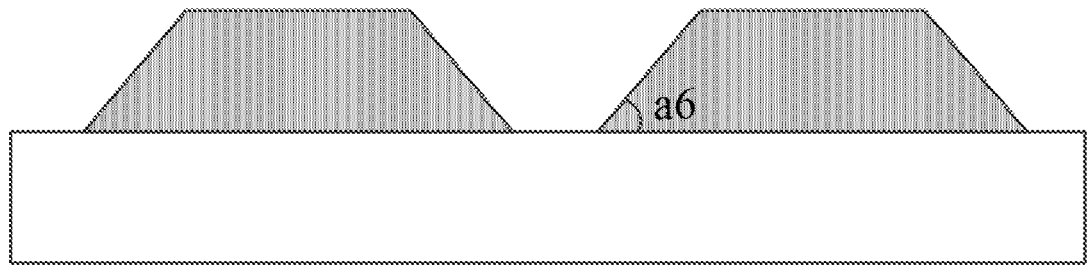
FIG. 4 is a schematic view showing a slope angle formed through an Al wet etching process according to one embodiment of the present disclosure.

The present disclosure will be described hereinafter in details in conjunction with the embodiments and drawings.

In an OLED display product, a scanning signal for driving pixels is controlled by shift register units (also called as GOA units). A minimum unit of the GOA unit is a transistor, and the transistors have different functions and different sizes. As a commonly-used Low Temperature Polycrystalline Silicon (LTPS) transistor, a double-gate transistor is used to reduce a leakage current between a source electrode and a drain electrode. At this time, gate lines are formed at a same layer, and a distance between the lines needs to be taken into consideration in the manufacture process, so as to prevent the occurrence of incomplete etching or etching errors.

A narrow-bezel display product has attracted more and more attentions, and a non-display region where the GOA units are located has to be reduced, so the transistor density and line density increase too. In addition, for a high-definition display product, the line density of the transistor in the pixel is highly demanded, and new issues occur for the double-gate transistor due to the increase in the line density.

In the case of high definition, a space for each pixel is reduced to a process limit. During the formation of the transistor, an etching accuracy error and a position error occur for an etching process, so in the design, these errors need to be taken into consideration. In other words, a range of a design value needs to be provided in such a manner as to eliminate influences caused by these errors, so as to prevent the occurrence of incomplete etching. The etching process mainly includes dry etching and wet etching, which are different from each other in terms of the etching accuracy as well as slope angles. As shown in FIGS. 1 to 4, taking Mo as an example, a dry-etching slope angle a3 is smaller than a wet-etching slope angle a4. However, for some commonly-used metals, e.g., Al, a dry-etching slope angle a5 is greater than a wet-etching slope angle a6. Hence, in the case of high line density, the slope angle also needs to be taken into consideration during the etching.

For the transistor with a double-gate structure, a closed loop structure is easily formed, i.e., two ends of two gate electrode patterns have to be coupled to each other. An etchant is reserved in a region surrounded by the closed loop structure during the wet etching. The uncontrollability of an etching level increases and there is a large difference between an actual line width and the design value, so it is impossible to obtain the transistor with the predicted performance. Hence, there is an urgent need to provide a new structure, so as to ensure the accuracy of the transistor while providing the closed-loop structure, thereby to ensure the performance of the transistor.

Referring to FIGS. 5 to 8, the present disclosure provides in some embodiments a circuitry structure, which includes a base substrate, and a functional transistor and a signal transmission line 50 arranged on the base substrate. The functional transistor includes a first conductive connection member 40, a first electrode 301, a second electrode 302, at least two gate electrode patterns 20-T and at least one active pattern 10-T.

An orthogonal projection of the first electrode 301 onto the base substrate at least partially overlaps with an orthogonal projection of the active pattern 10-T onto the base substrate, and an orthogonal projection of the second electrode 302 onto the base substrate at least partially overlaps with the orthogonal projection of the active pattern 10-T onto the base substrate.

Orthogonal projections of the at least two gate electrode patterns 20-T onto the base substrate at least partially overlap with the orthogonal projection of the active pattern 10-T onto the base substrate, first ends 20-T1 of the at least two gate electrode patterns 20-T are coupled to each other, and the at least two gate electrode patterns form a non-closed loop structure on a film layer where the at least two gate electrode patterns are located. The first conductive connection member 40 is arranged at a layer different from the gate electrode pattern 20-T, and the first conductive connection member 40 is coupled to second ends 20-T2 of the at least two gate electrode patterns 20-T. The signal transmission line 50 is coupled to the first conductive connection member 40.

Illustratively, one of the first electrode 301 and the second electrode 302 serves as a source electrode of the functional transistor, and the other of the first electrode 301 and the second electrode 302 serves as a drain electrode of the functional transistor. There is an overlapping region between the orthogonal projection of the first electrode 301 onto the base substrate and the orthogonal projection of the active pattern 10-T onto the base substrate, and in the overlapping region, the first electrode 301 is coupled to the active pattern 10-T through a via-hole Via1. There is an overlapping region between the orthogonal projection of the second electrode 302 onto the base substrate and the orthogonal projection of the active pattern 10-T onto the base substrate, and in the overlapping region, the second electrode 302 is coupled to the active pattern 10-T through the via-hole Via1.

Figure 9:
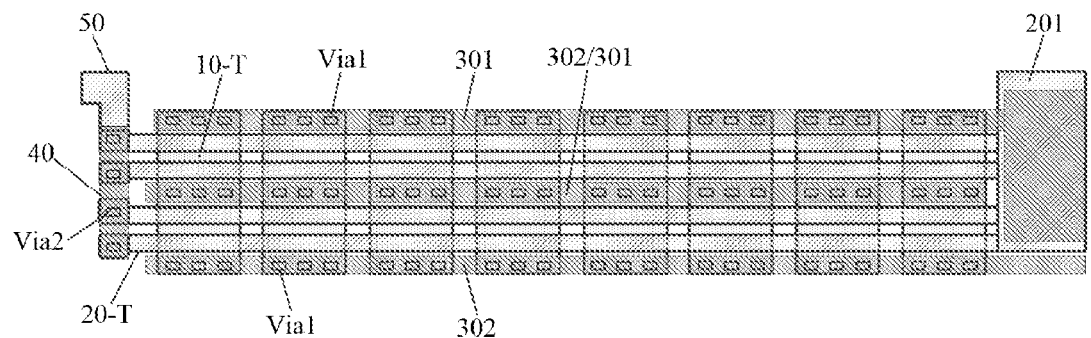
FIG. 9 is another schematic view showing a situation where the functional transistor is coupled to the signal transmission line according to one embodiment of the present disclosure.

As shown in FIG. 9, illustratively, when the functional transistor includes a plurality of active patterns 10-T, the first electrode 301 is coupled to the plurality of active patterns 10-T, and the second electrode 302 is coupled to the plurality of active patterns 10-T.

Figure 6:
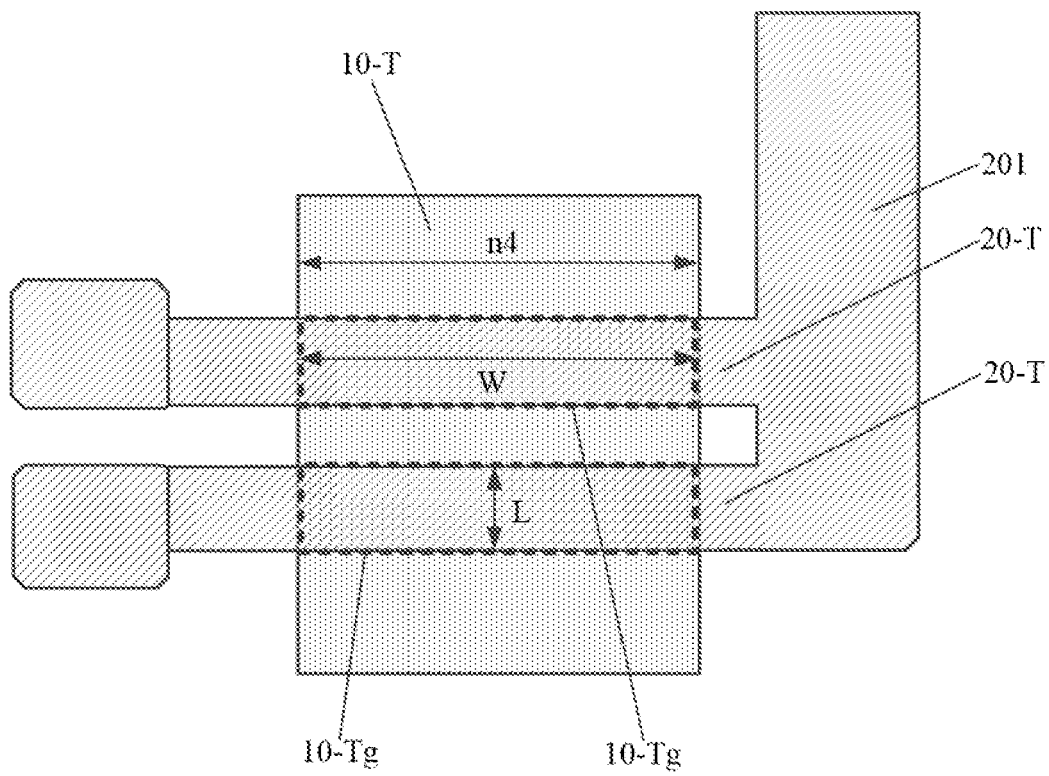
FIG. 6 is a schematic view showing the layout of an active layer and a gate metal layer in FIG. 5.

As shown in FIG. 6, illustratively, the orthogonal projection of each gate electrode pattern 20-T onto the base substrate at least partially overlaps with the orthogonal projection of the active pattern 10-T onto the base substrate, and a portion of the active pattern 10-T overlapping with the gate electrode pattern 20-T forms a channel portion 10-Tg of the functional transistor.

Illustratively, the plurality of active patterns 10-T is arranged in a first direction, the at least two gate electrode patterns 20-T are arranged in a second direction, the gate electrode patterns 20-T extend in the first direction. The first electrode 301 and the second electrode 302 are arranged opposite to each other in the second direction. At least a part of the orthogonal projection of the gate electrode pattern 20-T onto the base substrate is located between the orthogonal projection of the first electrode 301 onto the base substrate and the orthogonal projection of the second electrode 302 onto the base substrate. Illustratively, the first direction includes a horizontal direction and the second direction includes a longitudinal direction.

Illustratively, there is an overlapping region between an orthogonal projection of the first conductive connection member 40 onto the base substrate and an orthogonal projection of the second end 20-T2 of the gate electrode pattern 20-T onto the base substrate, and in the overlapping region, the first conductive connection member 40 is coupled to the second end 20-T2 of the gate electrode pattern 20-T through a via-hole.

Illustratively, the signal transmission line 50 is arranged close to the second end 20-T2 of the gate electrode pattern 20-T.

Illustratively, the at least two gate electrode patterns are formed through wet etching. That is, the at least two gate electrode patterns are etched using an etchant.

According to the circuitry structure in the embodiments of the present disclosure, the first ends 20-T1 of the at least two gate electrode patterns 20-T of the functional transistor are coupled to each other, and the second ends 20-T2 of the at least two gate electrode patterns 20-T are coupled to each other through the first conductive connection member 40. The first conductive connection member 40 is arranged at a layer different from the gate electrode pattern 20-T, so there is an opening between the second ends 20-T2 of the adjacent gate electrode patterns 20-T, and it is able to prevent the formation of the closed-loop structure in the film layer where the gate electrode pattern 20-T is arranged. During the formation of the gate electrode pattern 20-T through etching, the etchant flows through the opening between the adjacent gate electrode patterns 20-T, so it is able to prevent the etching accuracy from being adversely affected when the uncontrollability of the etching level is caused by the etchant reserved between the adjacent gate electrode patterns 20-T, thereby to achieve the wiring at a high density. In the embodiments of the present disclosure, a three-dimensional closed-loop structure is formed, so it is able to ensure that the two ends of the gate electrode patterns 20-T are coupled to each other and that the size of the gate electrode pattern 20-T is consistent with the design value, thereby to ensure the predicted performance of the functional transistor.

In addition, in the embodiments of the present disclosure, the second ends 20-T2 of the at least two gate electrode patterns 20-T are coupled to each other through the first conductive connection member 40, so that the signal transmission line 50 is coupled to the first conductive connection member 40. In this regard, it is able for the signal transmission line 50 to be electrically coupled to the gate electrode pattern 20-T, and it is able to prevent the circuitry structure from being damaged by a large current when the signal transmission line 50 is merely electrically coupled to the second end 20-T2 of one gate electrode pattern 20-T. In addition, the signal transmission line 50 is arranged close to the second end 20-T2 of the gate electrode pattern 20-T, so when the signal transmission line 50 is coupled to the first conductive connection member 40, it is able to shorten a current transmission path and reduce RC loading on the signal transmission line 50, thereby to prevent the occurrence of a signal error.

Figure 7:
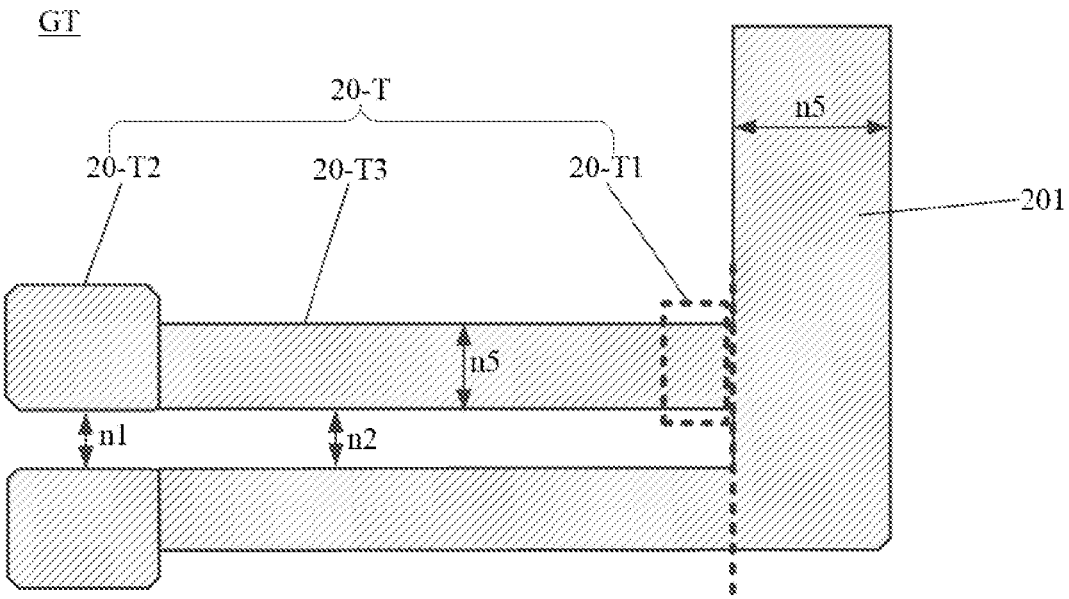

As shown in FIG. 7, in some embodiments of the present disclosure, a distance n1 between the second ends 20-T2 of adjacent gate electrode patterns 20-T is greater than or equal to a distance n2 between middle portions 20-T3 of the adjacent gate electrode patterns 20-T, and the middle portion 20-T3 is located between the first end 20-T1 and the second end 20-T2.

Illustratively, a width of the second end 20-T2 in the second direction is greater than a width of the middle portion 20-T3. In this way, it is able to increase an overlapping region between the orthogonal projections of the second end 20-T2 and the first conductive connection member 40, thereby to improve the electrical connection reliability of the first conductive connection member 40 with the second end 20-T2 of the gate electrode pattern 20-T.

In the embodiments of the present disclosure, when the distance between the second ends 20-T2 of the adjacent gate electrode patterns 20-T is greater than or equal to the distance between the middle portions 20-T3 of the adjacent gate electrode patterns 20-T, it is able to ensure a width of the opening between the second ends 20-T2 of the adjacent gate electrode patterns 20-T, thereby to enable the etchant to flow through the opening in a better manner.

As shown in FIG. 7, in some embodiments of the present disclosure, the functional transistor further includes a second conductive connection member 201, the first ends 20-T1 of the at least two gate electrode patterns 20-T are coupled to each other through the second conductive connection member 201, and the second conductive connection member 201 is arranged at a same layer and made of a same material as the gate electrode pattern 20-T.

Illustratively, the second conductive connection member 201 and the first ends 20-T1 of the at least two gate electrode patterns 20-T form a one-piece structure.

Illustratively, the second conductive connection member 201 is reused as a polar plate of a capacitor to which the gate electrode pattern 20-T of the functional transistor is coupled. In this way, it is able to prevent a connection line between the polar plate of the capacitor and the gate electrode pattern 20-T from being broken.

Based on the above, it is able to improve the stability of the circuitry structure and meanwhile reduce the layout space occupied by the circuitry structure.

Figure 8:
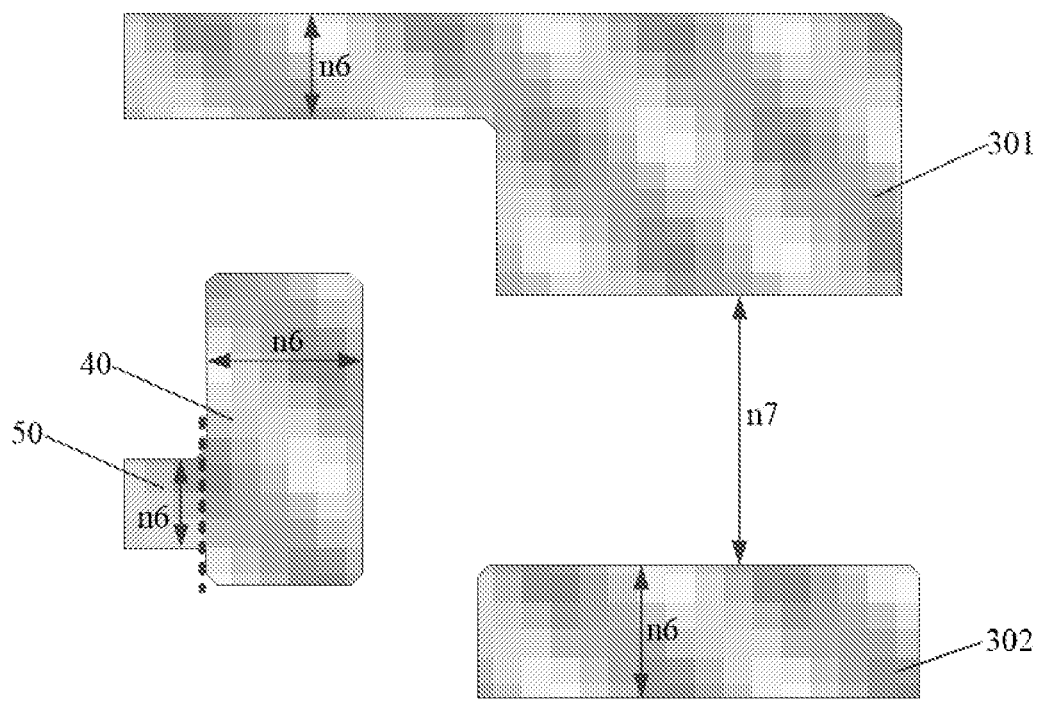
FIG. 8 is a schematic view showing the layout of a source/drain metal layer in FIG. 5.

As shown in FIG. 8, in some embodiments of the present disclosure, the first conductive connection member 40 is arranged at a same layer and made of a same material as the first electrode 301 and the second electrode 302.

Based on the above, the first conductive connection member 40 is formed through a same patterning process as the first electrode 301 and the second electrode 302, so it is able to form the first conductive connection member 40 without any additional patterning process, thereby to simplify the manufacture of the circuitry structure and reduce the manufacture cost.

As shown in FIG. 8, in some embodiments of the present disclosure, the signal transmission line 50 and the first conductive connection member 40 form a one-piece structure.

Based on the above, it is able to not only ensure the electrical connection reliability between the first conductive connection member 40 and the signal transmission line 50, but also form the signal transmission line and the first conductive connection member 40 through a same patterning process.

Figure 11:
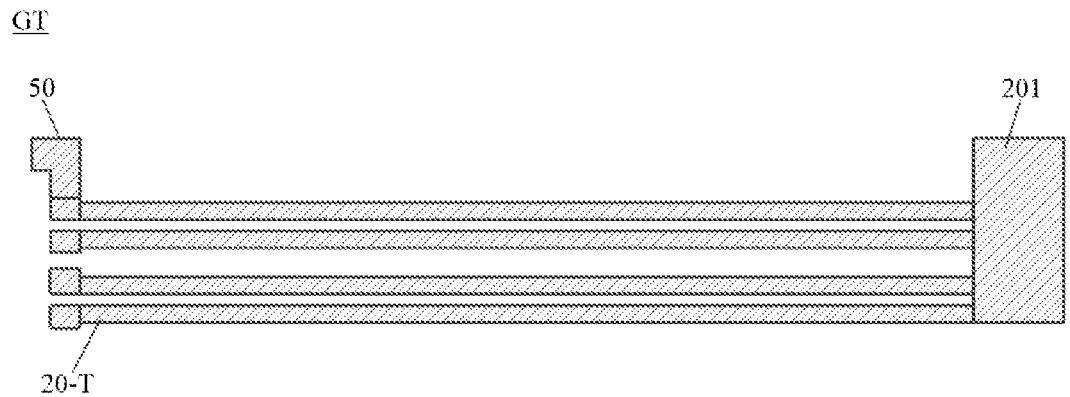
Figure 12:
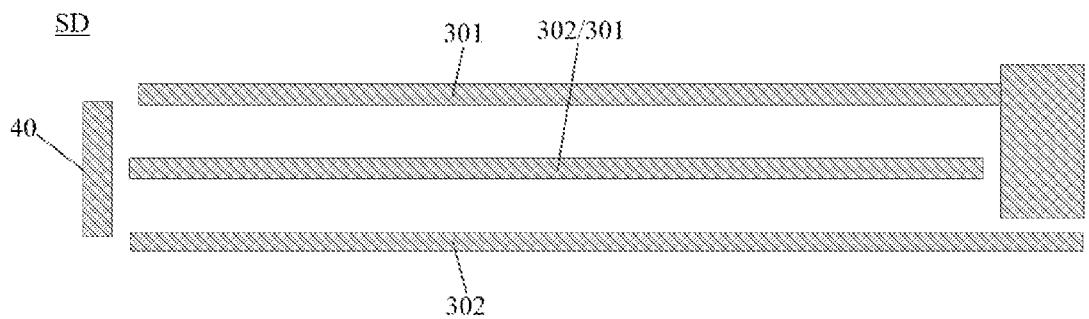
FIG. 12 is a schematic view showing the layout of the source/drain metal layer in FIG. 9.

As shown in FIGS. 9 and 11, in some embodiments of the present disclosure, the signal transmission line 50 is arranged at a same layer and made of a same material as the gate electrode pattern 20-T.

Illustratively, the signal transmission line 50 is in contact with the second end 20-T2 of one of the gate electrode patterns 20-T.

Based on the above, the signal transmission line 50 and the gate electrode pattern 20-T are formed through a same patterning process, so it is able to simplify the manufacture of the circuitry structure and reduce the manufacture cost. In addition, when the signal transmission line 50 is in contact with the second end 20-T2 of one of the gate electrode patterns 20-T, it is able for the etchant to flow through the opening between the second ends 20-T2 of the adjacent gate electrode patterns 20-T.

As shown in FIGS. 9 to 12, in some embodiments of the present disclosure, the functional transistor includes at least two active patterns 10-T arranged in a first direction, the gate electrode pattern 20-T extends in the first direction, the first electrode 301 and the second electrode 302 are arranged opposite to each other in a second direction, and the first direction intersects the second direction.

Illustratively, the gate electrode pattern 20-T is made of, but not limited to, molybdenum (Mo), aluminium (Al) or neodymium (Nd).

Illustratively, the first electrode 301 and the second electrode 302 are made of, but not limited to, copper (Cu), titanium (Ti) or Al.

Illustratively, the active pattern 10-T is made of, but not limited to, indium gallium zinc oxide (IGZO), low temperature polysilicon or a-Si.

As shown in FIGS. 9 to 12, in some embodiments of the present disclosure, the circuitry structure includes at least two the functional transistors arranged along the second direction, the first conductive connection members 40 of the at least two the functional transistors form a one-piece structure, the second conductive connection members 201 of the at least two the functional transistors form a one-piece structure, and the second electrode 302 of one functional transistor of the adjacent to functional transistors is reused as the first electrode 301 of the other functional transistor.

Illustratively, the at least two functional transistors are coupled to each other in series. The active patterns 10-T of the functional transistors are arranged along the first direction. The gate electrode patterns 20-T of the functional transistors are arranged in the second direction.

Illustratively, the active patterns 10-T of the functional transistors arranged in the second direction form a one-piece structure.

In the above-mentioned circuitry structure, when the at least two functional transistors are coupled to each other in series, it is able to improve the large current carrying capacity of the functional transistors. When the second electrode 302 of one functional transistor is reused as the first electrode 301 of the other functional transistor in two adjacent functional transistors, it is able to reduce the layout space occupied by the functional transistors.

As shown in FIGS. 5-12, in some embodiments of the present disclosure, the circuitry structure includes an active layer ACT, a gate insulation layer, a gate metal layer GT, an interlayer insulation layer and a source/drain metal layer SD laminated one on another on the base substrate along a direction away from the base substrate. The active layer ACT includes a plurality of first functional patterns, and the first functional pattern includes the active pattern 10-T. The gate metal layer GT includes a plurality of second functional patterns, and the second functional pattern includes the gate electrode pattern 20-T. The interlayer insulation layer includes a plurality of via-holes (such as Via1 and Via2). The source/drain metal layer SD includes a plurality of third functional patterns, and the third functional pattern includes the first electrode 301 and the second electrode 302.

Illustratively, in addition to the active pattern 10-T, the first functional pattern includes the other functional structures.

Illustratively, in addition to the gate electrode pattern 20-T, the second functional pattern includes the other functional structures which include, but not limited to, the second conductive connection member 201 and the signal transmission line 50.

Illustratively, in addition to the first electrode 301 and the second electrode 302, the third functional pattern includes the other functional structures which include, but not limited to, the first conductive connection member 40 and the signal transmission line 50.

Illustratively, the plurality of via-holes in the interlayer insulation layer includes a via-hole through which the first functional pattern is coupled to the third functional pattern, and a via-hole through which the second functional pattern is coupled to the third functional pattern.

Figure 10:
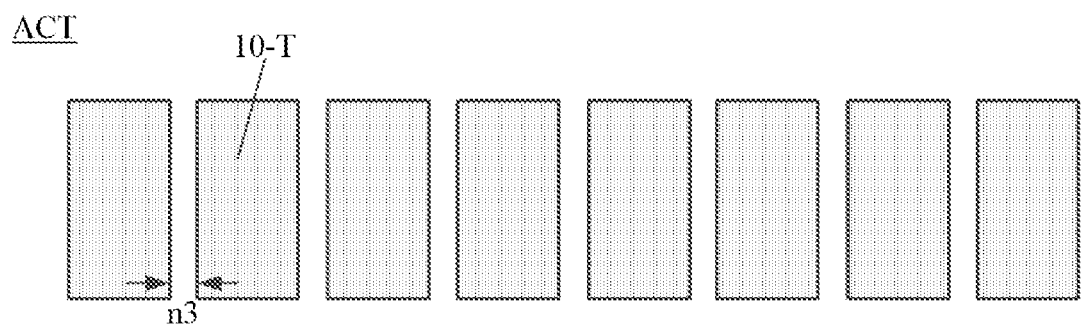
FIG. 10 is a schematic view showing the layout of the active layer in FIG. 9.

As shown in FIGS. 6 and 10, in some embodiments of the present disclosure, a width n4 of the first functional pattern in a direction perpendicular to an extending direction of the first functional pattern is greater than or equal to $a+Xa+Ya$, where $4.5 \ \mu m \leq a \leq 7 \ \mu m$, $0.1 \ \mu m \leq Xa \leq 0.5 \ \mu m$, and $0.1 \ \mu m \leq Ya \leq 0.5 \ \mu m$.

Illustratively, a represents a minimum width of the first functional pattern, and it has a value of, but not limited to, $4.5 \ \mu m$, $5 \ \mu m$, $5.5 \ \mu m$, $6 \ \mu m$, $6.5 \ \mu m$ or $7 \ \mu m$.

Xa represents the bilateral etching accuracy of the first functional pattern, and it has a value of, but not limited to, $0.1 \ \mu m$, $0.2 \ \mu m$, $0.3 \ \mu m$, $0.4 \ \mu m$ or $0.5 \ \mu m$.

Ya represents an exposure position offset of the first functional pattern, and it has a value of, but not limited to, $0.1 \ \mu m$, $0.2 \ \mu m$, $0.3 \ \mu m$, $0.4 \ \mu m$ or $0.5 \ \mu m$.

It should be appreciated that, the width of the first functional pattern in the direction perpendicular to its extending direction is related to a material and an etching process thereof, and the width should be not less than $a+Xa+Ya$.

Illustratively, a thickness of the first functional pattern is between 300 Å and 500 Å, e.g., 300 Å, 350 Å, 400 Å, 450 Å or 500 Å.

Illustratively, a distance between the adjacent first functional patterns is greater than or equal to $Xa+4 \ \mu m$.

As shown in FIG. 10, illustratively, a distance n3 between the adjacent active patterns 10-T in the first direction is greater than or equal to $Xa+4 \ \mu m$.

When the width of the first functional pattern and the distance between adjacent the first functional patterns are set as mentioned hereinabove, it is able to ensure the reliability and functional characteristics of the first functional pattern, and minimize the layout space occupied by the first functional pattern, thereby to facilitate the wiring at a high density and provide the high-definition circuitry structure.

As shown in FIG. 7, in some embodiments of the present disclosure, a width n5 of the second functional pattern in a direction perpendicular to an extending direction of the second functional pattern is greater than or equal to $g+Xg+Yg+2*d1/\tan(\alpha 1)$, where $4.5 \ \mu m \leq g \leq 6.5 \ \mu m$, $0.6 \ \mu m \leq Xg \leq 2 \ \mu m$, $0.6 \ \mu m \leq Yg \leq 2 \ \mu m$, $\alpha 1$ is a slope angle of the second functional pattern, and $2000 \ \text{Å} \leq d1 \leq 8000 \ \text{Å}$.

Illustratively, g represents a minimum width of the second functional pattern, and it has a value of, but not limited to, $4.5 \ \mu m$, $5 \ \mu m$, $5.5 \ \mu m$, $6 \ \mu m$ or $6.5 \ \mu m$.

Xg represents the bilateral etching accuracy of the second functional pattern, and it has a value of, but not limited to, $0.8 \ \mu m$, $1 \ \mu m$, $1.2 \ \mu m$, $1.4 \ \mu m$, $1.6 \ \mu m$ or $1.8 \ \mu m$.

Yg represents an exposure position offset of the second functional pattern, and it has a value of, but not limited to, $0.8 \ \mu m$, $1 \ \mu m$, $1.2 \ \mu m$, $1.4 \ \mu m$, $1.6 \ \mu m$ or $1.8 \ \mu m$.

d1 represents a thickness of the second functional pattern, and it has a value of, but not limited to, 3000 Å, 4000 Å, 5000 Å, 6000 Å or 7000 Å.

It should be appreciated that, the width of the second functional pattern in the direction perpendicular to its extending direction is related to a material and an etching process thereof, and the width should be not less than $g+Xg+Yg+2*d1/\tan(\alpha 1)$.

Illustratively, a distance between the adjacent second functional patterns is greater than or equal to $Xg+2 \ \mu m$.

As shown in FIG. 7, illustratively, a distance between the adjacent gate electrode patterns 20-T (e.g. n2) is greater than or equal to $Xg+2 \ \mu m$.

When the width of the second functional pattern and the distance between adjacent the second functional patterns are set as mentioned hereinabove, it is able to ensure the reliability and functional characteristics of the second functional pattern, and minimize the layout space occupied by the second functional pattern, thereby to facilitate the wiring at a high density and provide the high-definition circuitry structure.

As shown in FIG. 8, in some embodiments of the present disclosure, a width n6 of the third functional pattern in a direction perpendicular to an extending direction of the third functional pattern is greater than or equal to $s+Xs+Ys+2*d2/\tan(\alpha 2)$, where $4.5 \ \mu m \leq g \leq 6.5 \ \mu m$, $0.6 \ \mu m \leq Xs \leq 2 \ \mu m$, $0.6 \ \mu m \leq Ys \leq 2 \ \mu m$, $\alpha 2$ is a slope angle of the third functional pattern, and $2000 \ \text{Å} \leq d2 38000 \ \text{Å}$.

Illustratively, s represents a minimum width of the third functional pattern, and it has a value of, but not limited to, 4.5 µm, 5 µm, 5.5 µm, 6 µm or 6.5 µm.

Xs represents the bilateral etching accuracy of the third functional pattern, and it has a value of, but not limited to, 0.8 µm, 1 µm, 1.2 µm, 1.4 µm, 1.6 µm or 1.8 µm.

Ys represents an exposure position offset of the third functional pattern, and it has a value of 0.8 µm, 1 µm, 1.2 µm, 1.4 µm, 1.6 µm or 1.8 µm.

d2 represents a thickness of the third functional pattern, and it has a value of, but not limited to, 3000 Å, 4000 Å, 5000 Å, 6000 Å or 7000 Å.

It should be appreciated that, the width of the third functional pattern in the direction perpendicular to its extending direction is related to a material and an etching process thereof, and the width should be not less than s+Xs+Ys+2*d2/tan ($\alpha 2$).

Illustratively, a distance between adjacent third functional patterns is greater than or equal to Xs+2 µm.

As shown in FIG. 8, illustratively, a distance n7 between the first electrode 301 and the second electrode 302 adjacent to each other is greater than or equal to Xs+2 µm.

When the width of the third functional pattern and the distance between adjacent the third functional patterns are set as mentioned hereinabove, it is able to ensure the reliability and functional characteristics of the third functional pattern, and minimize the layout space occupied by the third functional pattern, thereby to facilitate the wiring at a high density and provide the high-definition circuitry structure.

It should be appreciated that, the values of the above-mentioned minimum widths a, g and s are related to functions. For example, when the second functional pattern is the gate electrode pattern 20-T, the value of g is 4.5 µm, and when the second functional pattern is the signal transmission line 50, the value of g is 6.5 µm. When the width of the gate electrode pattern 20-T is reduced, it is able to reduce the layout space occupied by the circuitry structure. When the thickness of the signal transmission line 50 is increased, it is able to reduce the RC loading.

As shown in FIGS. 5 to 12, in some embodiments of the present disclosure, the third functional pattern is coupled to the first functional pattern through a corresponding via-hole Via1, and the third functional pattern is coupled to the second functional pattern through a corresponding via-hole Via2. A pore size H of the via-hole satisfies H≥h, and 1 µm≤h≤3 µm.

H represents a minimum pore size of the via-hole, and it has a value of, but not limited to, 1.2 µm, 1.4 µm, 1.6 µm, 1.8 µm, 2.0 µm, 2.1 µm, 2.2 µm, 2.4 µm, 2.6 µm or 2.8 µm.

When the pore size of the via-hole is set as mentioned hereinabove, it is able to ensure the reliability of the via-hole, and minimize the layout space occupied by the via, thereby to facilitate the wiring at a high density and provide the high-definition circuitry structure.

In some embodiments of the present disclosure, a distance between a boundary of the orthogonal projection of the first functional pattern onto the base substrate and a boundary of an orthogonal projection of the via-hole onto the base substrate is greater than or equal to H+Xh+Yh; and/or a distance between a boundary of the orthogonal projection of the second functional pattern onto the base substrate and the boundary of the orthogonal projection of the via-hole onto the base substrate is greater than or equal to H+Xh+Yh; and/or a distance between a boundary of an orthogonal projection of the third functional pattern onto the base substrate and the boundary of the orthogonal projection of the via-hole onto the base substrate is greater than or equal to H+Xh+Yh, where 0.1 µm≤Xh≤1 µm, and 0.1 µm≤Yh≤1 µm.

Xh represents the etching accuracy, and it has a value of, but not limited to, 0.1 µm, 0.2 µm, 0.3 µm, 0.4 µm, 0.5 µm, 0.6 µm, 0.7 µm, 0.8 µm, 0.9 µm or 1.0 µm.

Yh represents an exposure position offset, and it has a value of, but not limited to, 0.1 µm, 0.2 µm, 0.3 µm, 0.4 µm, 0.5µ, 0.6 µm, 0.7 µm, 0.8 µm, 0.9 µm or 1.0 µm.

Based on the above, it is able to ensure the layout reliability of the first functional pattern, the second functional pattern, the third functional pattern and the via-holes, ensure the connection performance between the third functional pattern and the first functional pattern through the corresponding via-hole, and ensure the connection performance between the third functional pattern and the second functional pattern through the corresponding via-hole.

In some embodiments of the present disclosure, a distance n8 between the orthogonal projection of the first electrode 301 onto the base substrate and/or the orthogonal projection of the second electrode 302 onto the base substrate and the orthogonal projection of the adjacent gate electrode pattern 20-T onto the base substrate is greater than or equal to (Xg+Yg+Xs+Ys)/2, where 0.6 µm≤Xg≤2 µm, 0.6 µm≤Yg≤2 µm, 0.6 µm≤Xs≤2 µm, and 0.6 µm≤Ys≤2 µm.

Based on the above, it is able to ensure the reliability of the functional transistor as well as the stable functional characteristics of the functional transistor.

Figure 5:
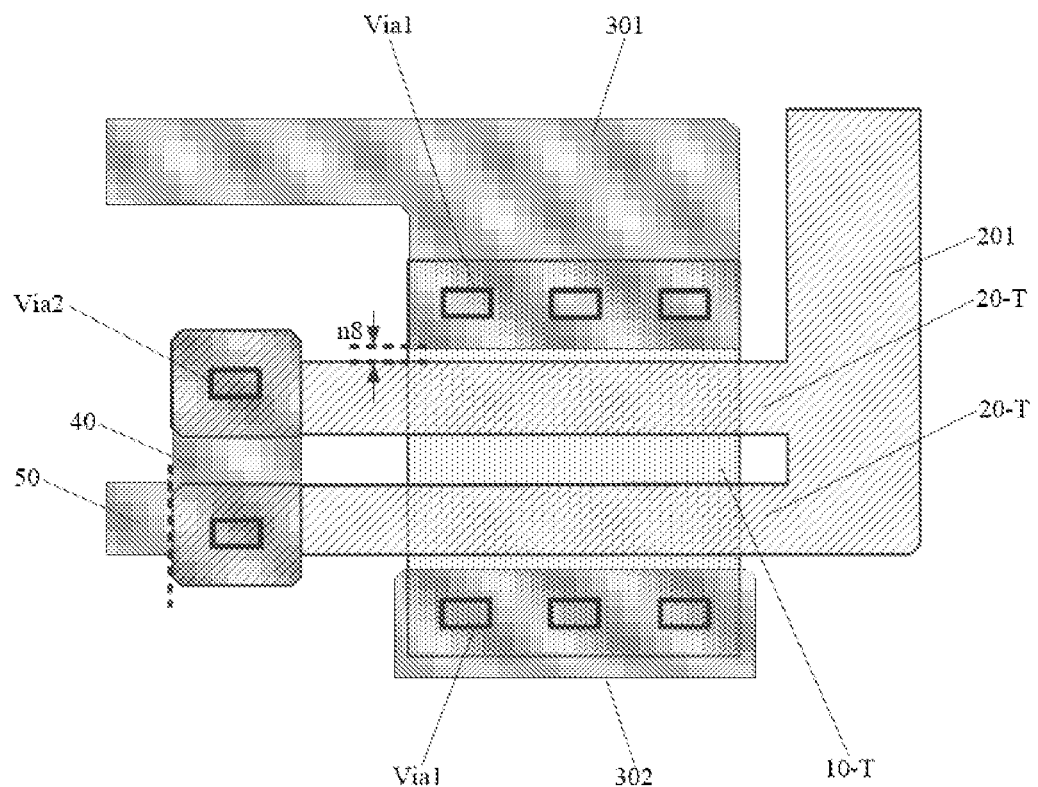
FIG. 5 is a schematic view showing a situation where a functional transistor is coupled to a signal transmission line according to one embodiment of the present disclosure.

As shown in FIGS. 5 and 6, in some embodiments of the present disclosure, the active pattern 10-T includes at least two channel portions 10-Tg, and an orthogonal projection of the channel portion 10-Tg onto the base substrate overlaps with the orthogonal projection of the corresponding gate electrode pattern 20-T onto the base substrate. A width W of the channel portion 10-Tg in an extending direction of the gate electrode pattern 20-T satisfies 5 µm≤W≤20 µm, and a length L of the channel portion 10-Tg in a direction perpendicular to the extending direction of the gate electrode pattern 20-T satisfies 2 µm≤L≤4 µm.

Illustratively, the width W of the channel portion 10-Tg has a value of, but not limited to, 5 µm, 8 µm, 10 µm, 12 µm, 14 µm, 16 µm, 18 µm or 20 µm.

Illustratively, the length L of the channel portion 10-Tg has a value of, but not limited to, 2 µm, 2.5 µm, 3 µm, 3.5 µm or 4 µm.

It should be appreciated that, the quantity of channel portions 10-Tg in the active pattern 10-T is related to the quantity of gate electrode patterns 20-T overlapping with the active pattern 10-T, i.e., when the active pattern 10-T includes two channel portions 10-Tg, the orthogonal projection of the channel portion 10-Tg onto the base substrate overlaps with the orthogonal projection of the corresponding gate electrode pattern 20-T onto the base substrate.

Based on the above, it is able to provide the functional pattern with an appropriate size while meeting the requirement on the performance, thereby to facilitate the wiring at a high density and provide the high-definition circuitry structure.

In some embodiments of the present disclosure, the circuitry structure includes a gate driving circuitry, the gate driving circuitry includes a gate driving signal output end and a pull-down transistor coupled to the gate driving signal output end, and the functional transistor includes the pull-down transistor.

Illustratively, the pull-down transistor includes a plurality of active patterns 10-T, each active pattern 10-T, the gate electrode pattern 20-T overlapping with the active pattern 10-T, the first electrode 301 and the second electrode 302 form a unit, the pull-down transistor includes the units coupled to each other in parallel, and a distance between the adjacent active patterns 10-T is greater than or equal to Xa+4 μm. The distance between the adjacent active patterns 10-T is related to a minimum density of the etching process.

Illustratively, the gate driving circuitry includes a plurality of cascaded shift register units.

Figure 14:
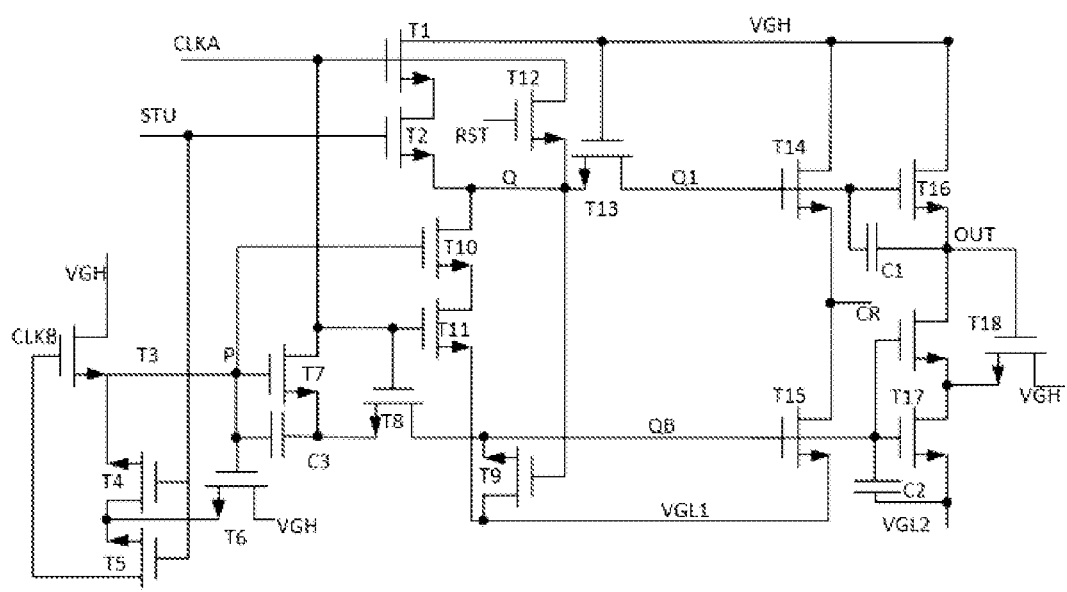
FIG. 14 is a schematic view showing a circuitry structure of a shift register unit according to one embodiment of the present disclosure.

As shown in FIG. 14, the shift register unit includes a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a twelfth transistor T12, a thirteenth transistor T13, a fourteenth transistor T14, a fifteenth transistor T15, a sixteenth transistor T16, a seventeenth transistor T17, an eighteenth transistor T18, a first capacitor C1, a second capacitor C2 and a third capacitor C3. It further includes a CLKA signal line, a STU signal line, a CLKB signal line, a VGH signal line, a VGL1 signal line, a VGL2 signal line, an ST signal line, a gate driving signal output end OUT, a triggering signal output end CR, a node P, a node Q, a node Q1 and a node QB.

The gate driving signal output end OUT is used to output a gate driving signal to the pixel driving circuitry in a display region. The triggering signal output end CR is used to output a triggering signal to the shift register units in the other row, so as to trigger the shift register units to start working.

Illustratively, the pull-down transistor is the seventeenth transistor T17, and it is configured to pull down a voltage on the gate driving signal output end OUT. Illustratively, the seventeenth transistor T17 includes two functional transistors coupled to each other in series.

Illustratively, a width of the channel portion 10-Tg in one functional transistor of the seventeenth transistor T17 is 22 μm, and a length of the channel portion 10-Tg is 2.5 μm. The functional transistor is of a double-gate structure, the total length of the channel portions 10-Tg of the functional transistor is 2.5 μm*2, and the functional transistor includes eight active patterns 10-T arranged in the first direction. The signal transmission line coupled to the node QB, i.e., the signal transmission line 50, is coupled to the first conductive connection member 40 and the gate electrode pattern 20-T of the seventeenth transistor T17.

In some embodiments of the present disclosure, the circuitry structure includes a gate driving circuitry, the gate driving circuitry includes a triggering signal output end and an output transistor coupled to the triggering signal output end, and the functional transistor includes the output transistor.

Figure 13:
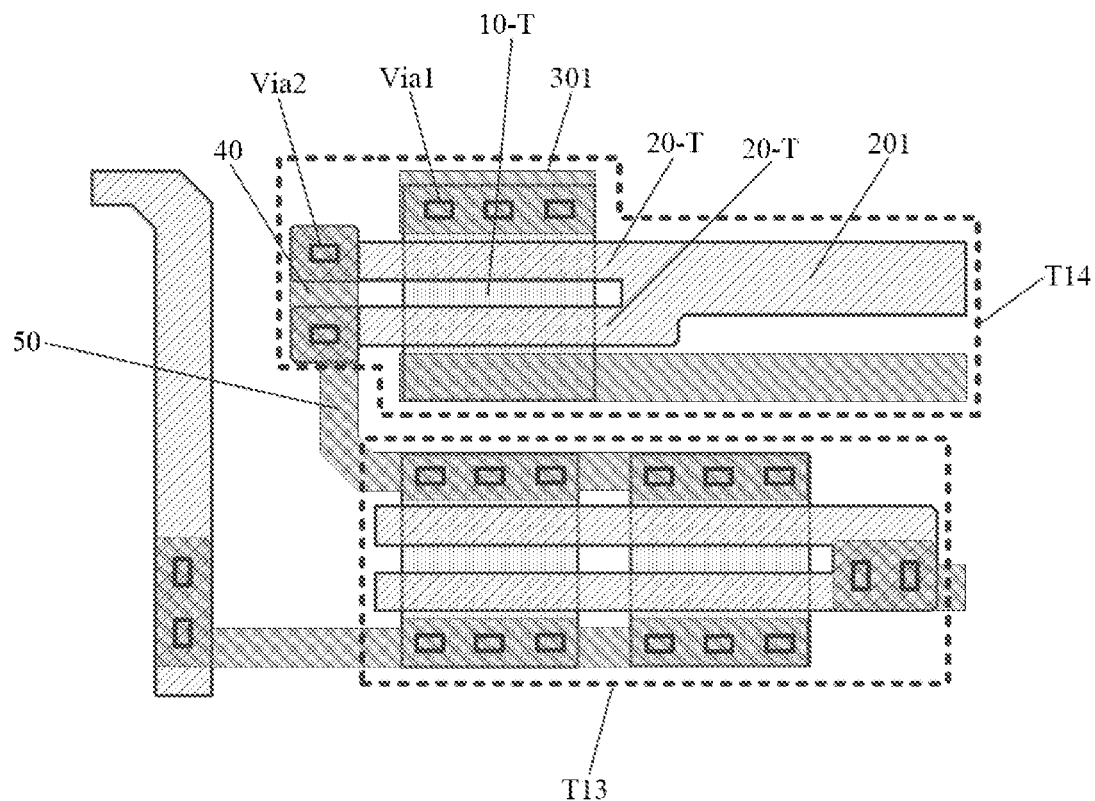
FIG. 13 is yet another schematic view showing a situation where the functional transistor is coupled to the signal transmission line according to one embodiment of the present disclosure.
Figure 15:
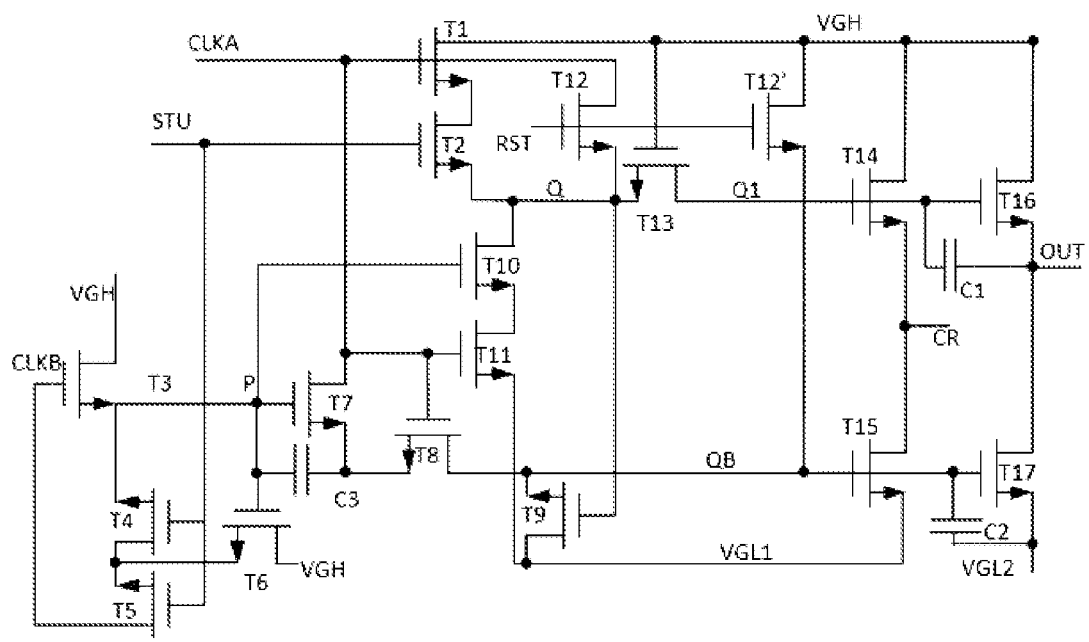
FIG. 15 is another schematic view showing the circuitry structure of the shift register unit according to one embodiment of the present disclosure.

As shown in FIGS. 13 and 15, the shift register unit includes a first transistor T1, a second transistor T2, a third transistor T3, a fourth transistor T4, a fifth transistor T5, a sixth transistor T6, a seventh transistor T7, an eighth transistor T8, a ninth transistor T9, a tenth transistor T10, an eleventh transistor T11, a twelfth transistor T12, a compensation transistor T12', a thirteenth transistor T13, a fourteenth transistor T14, a fifteenth transistor T15, a sixteenth transistor T16 and a seventeenth transistor T17, a first capacitor C1, a second capacitor C2 and a third capacitor C3. It further includes a CLKA signal line, a STU signal line, a CLKB signal line, a VGH signal line, a VGL1 signal line, a VGL2 signal line, an RST signal line, a gate driving signal output end OUT, a triggering signal output end CR, a node P, a node Q, a node Q1 and a node QB.

Illustratively, the output transistor coupled to the triggering signal output end is the fourteenth transistor T14.

Illustratively, a width of the channel portion 10-Tg of the fourteenth transistor T14 is 22 μm, and a length of the channel portion 10-Tg is 2.5 μm. The fourteenth transistor T14 is of a double-gate structure, and the total length of the channel portions 10-Tg of the fourteenth transistor T14 is 2.5 μm*2. The signal transmission line coupled to the node Q1, i.e., the signal transmission line 50, is coupled to the first conductive connection member 40 and the gate electrode pattern 20-T of the fourteenth transistor T14.

The present disclosure further provides in some embodiments a display substrate, which includes the above-mentioned circuitry structure.

In the above-mentioned circuitry structure, the first ends of the at least two gate electrode patterns of the functional transistor are coupled to each other, and the second ends of the at least two gate electrode patterns are coupled to each other through the first conductive connection member. The first conductive connection member is arranged at a layer different from the gate electrode pattern, so the opening is formed between the two second ends of the adjacent gate electrode patterns, and no closed-loop structure is formed in a film layer where the gate electrode pattern is located. During the formation of the gate electrode pattern through etching, the etchant flows through the opening between the adjacent gate electrode patterns, so it is able to prevent the actual etching accuracy from being adversely affected by the uncontrollability of the etching level when the etchant remains between the adjacent gate electrode patterns, and facilitate the wiring at a high density. In the embodiments of the present disclosure, a three-dimensional closed-loop structure is formed, so it is able to ensure that the two ends of the gate electrode patterns are coupled to each other and that the size of the gate electrode pattern is consistent with the design value, thereby to ensure the predicted performance of the functional transistor. In addition, in the embodiments of the present disclosure, the second ends of the at least two gate electrode patterns are coupled to each other through the first conductive connection member, so that the signal transmission line is coupled to the first conductive connection member. In this regard, it is able for the signal transmission line to be electrically coupled to the gate electrode pattern, and it is able to prevent the circuitry structure from being damaged by a large current when the signal transmission line is merely electrically coupled to the second end of one gate electrode pattern. In addition, the signal transmission line is arranged close to the second end of the gate electrode pattern, so when the signal transmission line is coupled to the first conductive connection member, it is able to shorten a current transmission path and reduce RC loading on the signal transmission line, thereby to prevent the occurrence of a signal error.

When the display substrate includes the above-mentioned circuitry structure, it also has the above-mentioned advantageous effects, which will not be particularly defined herein.

The present disclosure further provides in some embodiments a display device, which includes the above-mentioned display substrate.

It should be appreciated that, the display device may be any product or member having a display function, e.g., television, display, digital photo frame, mobile phone or tablet computer. The display device further includes a flexible circuit board, a printed circuit board and a back plate.

In the above-mentioned circuitry structure, the first ends of the at least two gate electrode patterns of the functional transistor are coupled to each other, and the second ends of the at least two gate electrode patterns are coupled to each other through the first conductive connection member. The first conductive connection member is arranged at a layer different from the gate electrode pattern, so the opening is formed between the two second ends of the adjacent gate electrode patterns, and no closed-loop structure is formed in a film layer where the gate electrode pattern is located. During the formation of the gate electrode pattern through etching, the etchant flows through the opening between the adjacent gate electrode patterns, so it is able to prevent the actual etching accuracy from being adversely affected by the uncontrollability of the etching level when the etchant remains between the adjacent gate electrode patterns, and facilitate the wiring at a high density. In the embodiments of the present disclosure, a three-dimensional closed-loop structure is formed, so it is able to ensure that the two ends of the gate electrode patterns are coupled to each other and that the size of the gate electrode pattern is consistent with the design value, thereby to ensure the predicted performance of the functional transistor. In addition, in the embodiments of the present disclosure, the second ends of the at least two gate electrode patterns are coupled to each other through the first conductive connection member, so that the signal transmission line is coupled to the first conductive connection member. In this regard, it is able for the signal transmission line to be electrically coupled to the gate electrode pattern, and it is able to prevent the circuitry structure from being damaged by a large current when the signal transmission line is merely electrically coupled to the second end of one gate electrode pattern. In addition, the signal transmission line is arranged close to the second end of the gate electrode pattern, so when the signal transmission line is coupled to the first conductive connection member, it is able to shorten a current transmission path and reduce RC loading on the signal transmission line, thereby to prevent the occurrence of a signal error.

When the display device includes the above-mentioned display substrate, it also has the above-mentioned advantageous effects, which will not be particularly defined herein.

It should be appreciated that, when a signal line extends in an X direction, it means that the signal line includes a primary portion and a secondary portion coupled to the primary portion. The primary portion is a line, a line segment or a strip-like structure. The primary portion extends in the X direction, and a length of the primary portion in the X direction is greater than a length of the secondary portion in the other direction.

It should be appreciated that, the expression "at a same layer" refers to that the film layers are arranged on a same structural layer. Alternatively, for example, the film layers on a same layer may be layer structures formed through forming thin layers for forming specific patterns through a single-film-forming process and then patterning the film layers with a same mask through a single patterning process. Depending on different specific patterns, a single patterning process may include multiple exposing, development or etching processes, and the specific patterns in the layer structure may be continuous or discontinuous. These specific patterns may also be arranged at different levels or have different thicknesses.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the product embodiments are substantially similar to the method embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It will be understood that when an element such as a layer, film, region or substrate is referred to as being "on" or "under" another element, it can be "directly on" or "directly under" the other element or intervening elements may be present.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A circuitry structure, comprising a base substrate, and a functional transistor and a signal transmission line arranged on the base substrate, wherein the functional transistor comprises a first conductive connection member, a first electrode, a second electrode, at least two gate electrode patterns and at least one active pattern; an orthogonal projection of the first electrode onto the base substrate at least partially overlaps with an orthogonal projection of the active pattern onto the base substrate, and an orthogonal projection of the second electrode onto the base substrate at least partially overlaps with the orthogonal projection of the active pattern onto the base substrate;

orthogonal projections of the at least two gate electrode patterns onto the base substrate at least partially overlap with the orthogonal projection of the active pattern onto the base substrate, first ends of the at least two gate electrode patterns are coupled to each other, and the at least two gate electrode patterns form a non-closed loop structure on a film layer where the at least two gate electrode patterns are located;

the first conductive connection member is arranged at a layer different from the gate electrode pattern and coupled to second ends of the at least two gate electrode patterns; and the signal transmission line is coupled to the first conductive connection member.

2. The circuitry structure according to claim 1, wherein a distance between the second ends of adjacent gate electrode patterns is greater than or equal to a distance between middle portions of the adjacent gate electrode patterns, and the middle portion is located between the first end and second end.

3. The circuitry structure according to claim 1, wherein the functional transistor further comprises a second conductive connection member, the first ends of the at least two gate electrode patterns are coupled to each other through the second conductive connection member, and the second conductive connection member is arranged at a same layer and made of a same material as the gate electrode patterns.

4. The circuitry structure according to claim 1, wherein the first conductive connection member is arranged at a same layer and made of a same material as the first electrode and the second electrode.

5. The circuitry structure according to claim 1, wherein the signal transmission line and the first conductive connection member form a one-piece structure.

6. The circuitry structure according to claim 1, wherein the signal transmission line is arranged at a same layer and made of a same material as the gate electrode pattern, wherein the signal transmission line is in contact with a second end of one of the gate electrode patterns.

7. The circuitry structure according to claim 1, wherein the functional transistor comprises at least two active patterns arranged in a first direction, the gate electrode pattern extends in the first direction, the first electrode and the second electrode are arranged opposite to each other in a second direction, and the first direction intersects the second direction, wherein the circuitry structure comprises at least two functional transistors arranged in the second direction, the first conductive connection members of the at least two functional transistors form a one-piece structure, the second conductive connection members of the at least two functional transistors form a one-piece structure, and a second electrode of one of the two adjacent functional transistors is reused as a first electrode of the other functional transistor.

8. The circuitry structure according to claim 1, wherein the circuitry structure comprises an active layer, a gate insulation layer, a gate metal layer, an interlayer insulation layer and a source/drain metal layer laminated one on another on the base substrate in a direction away from the base substrate, the active layer comprises a plurality of first functional patterns, the first functional patterns comprise the active patterns, the gate metal layer comprises a plurality of second functional patterns, the second functional patterns comprise the gate electrode patterns, the interlayer insulation layer comprises a plurality of via-holes, the source/drain metal layer comprises a plurality of third functional patterns, and the third functional patterns comprise the first electrode and the second electrode.

9. The circuitry structure according to claim 8, wherein a width of the first functional pattern in a direction perpendicular to an extending direction of the first functional pattern is greater than or equal to a+Xa+Ya, where 4.5 µm≤a≤7 µm, 0.1 µm≤Xa≤0.5 µm, and 0.1 µm≤Ya≤0.5 µm, wherein a distance between adjacent first functional patterns is greater than or equal to Xa+4 µm.

10. The circuitry structure according to claim 8, wherein a width of the second functional pattern in a direction perpendicular to an extending direction of the second functional pattern is greater than or equal to g+Xg+Yg+2*d1/tan (α1), where 4.5 µm≤g≤6.5 µm, 0.6 µm≤Xg≤2 µm, 0.6 µm≤Yg≤2 µm, α1 is a slope angle of the second functional pattern, and 2000 Å≤d1≤8000 Å, wherein a distance between adjacent second functional patterns is greater than or equal to Xg+2 µm.

11. The circuitry structure according to claim 10, wherein a distance between a boundary of an orthogonal projection of the first functional pattern onto the base substrate and a boundary of an orthogonal projection of the corresponding via-hole onto the base substrate is greater than or equal to H+Xh+Yh; and/or
a distance between a boundary of an orthogonal projection of the second functional pattern onto the base substrate and a boundary of an orthogonal projection of the corresponding via-hole onto the base substrate is greater than or equal to H+Xh+Yh; and/or
a distance between a boundary of an orthogonal projection of the third functional pattern onto the base substrate and a boundary of an orthogonal projection of the corresponding via-hole onto the base substrate is greater than or equal to H+Xh+Yh, where 0.1 µm≤Xh≤1 µm, and 0.1 µm≤Yh≤1 µm.

12. The circuitry structure according to claim 8, wherein a width of the third functional pattern in a direction perpendicular to an extending direction of the third functional pattern is greater than or equal to s+Xs+Ys+2*d2/tan (α2), where 4.5 µm≤g≤6.5 µm, 0.6 µm≤Xs≤2 µm, 0.6 µm≤Ys≤2 µm, α2 is a slope angle of the third functional pattern, and 2000 Å≤d2≤8000 Å.

13. The circuitry structure according to claim 12, wherein a distance between adjacent third functional patterns is greater than or equal to Xs+2 µm.

14. The circuitry structure according to claim 8, wherein the third functional pattern is coupled to the first functional pattern through a corresponding via-hole and coupled to the second functional pattern through a corresponding via-hole, pore sizes H of the via-holes satisfy H≥h, and 1 µm≤h≤3 µm.

15. The circuitry structure according to claim 1, wherein a distance between the orthogonal projection of the first electrode onto the base substrate and/or the orthogonal projection of the second electrode onto the base substrate and the orthogonal projection of the adjacent gate electrode pattern onto the base substrate is greater than or equal to (Xg+Yg+Xs+Ys)/2, where 0.6 µm≤Xg≤2 µm, 0.6 µm≤Yg≤2 µm, 0.6 µm≤Xs≤2 µm, and 0.6 µm≤Ys≤2 µm.

16. The circuitry structure according to claim 1, wherein the active pattern comprises at least two channel portions, an orthogonal projection of the channel portion onto the base substrate overlaps with the orthogonal projection of the corresponding gate electrode pattern onto the base substrate, a width W of the channel portion in an extending direction of the gate electrode pattern satisfies 5 µm≤W≤20 µm, and a length L of the channel portion in a direction perpendicular to the extending direction of the gate electrode pattern satisfies 2 µm≤L≤4 µm.

17. The circuitry structure according to claim 1, wherein the circuitry structure comprises a gate driving circuitry, the gate driving circuitry comprises a gate driving signal output end and a pull-down transistor coupled to the gate driving signal output end, and the functional transistor comprises the pull-down transistor.

18. The circuitry structure according to claim 1, wherein the circuitry structure comprises a gate driving circuitry, the gate driving circuitry comprises a triggering signal output end and an output transistor coupled to the triggering signal output end, and the functional transistor comprises the output transistor.

19. The circuitry structure according to claim 1, wherein the at least two gate electrode patterns are formed through wet etching.

20. A display substrate, comprising the circuitry structure according to claim 1.

\* \* \* \* \*